(12) United States Patent
Milon et al.

(10) Patent No.: US 8,823,553 B2
(45) Date of Patent: Sep. 2, 2014

(54) TRAFFIC DETECTOR

(75) Inventors: Christophe Milon, Lannion (FR);
Jean-Claude Dubois, Lannion (FR)

(73) Assignee: Eco Compteur, Lannion (FR)

( * ) Notice: Subject to any disclaimer, the term of this patent is extended or adjusted under 35 U.S.C. 154(b) by 437 days.

(21) Appl. No.: 13/387,860

(22) PCT Filed: Jul. 29, 2010

(86) PCT No.: PCT/EP2010/061014
§ 371 (c)(1),
(2), (4) Date: Jan. 30, 2012

(87) PCT Pub. No.: WO2011/012670
PCT Pub. Date: Feb. 3, 2011

(65) Prior Publication Data
US 2012/0128115 A1    May 24, 2012

(30) Foreign Application Priority Data

Jul. 31, 2009 (FR) ...................................... 09 55384

(51) Int. Cl.
| | |
|---|---|
| *G08G 1/02* | (2006.01) |
| *H01L 41/053* | (2006.01) |
| *H01L 41/113* | (2006.01) |
| *G08G 1/065* | (2006.01) |
| *G08G 1/01* | (2006.01) |
| *B41J 3/42* | (2006.01) |
| *H01H 35/00* | (2006.01) |

(52) U.S. Cl.
CPC ............... *G08G 1/02* (2013.01); *H01L 41/053* (2013.01); *H01L 41/1132* (2013.01); *G08G 1/065* (2013.01)
USPC ............. 340/940; 340/933; 340/941; 404/72; 200/86 A

(58) Field of Classification Search
USPC ............ 340/933, 940, 941; 404/72; 200/86 A
See application file for complete search history.

(56) References Cited

U.S. PATENT DOCUMENTS

| | | | |
|---|---|---|---|
| 5,554,907 A | 9/1996 | Dixon | |
| 6,744,378 B1 * | 6/2004 | Tyburski | ........................ 340/933 |
| 7,417,561 B2 * | 8/2008 | Reed et al. | ...................... 340/940 |
| 8,413,519 B2 * | 4/2013 | Weston | ............... 73/777 |
| 2003/0201909 A1 * | 10/2003 | Hilliard | ........................ 340/940 |

FOREIGN PATENT DOCUMENTS

FR        2881861        8/2006

OTHER PUBLICATIONS

International Search Report for PCT/EP2010/061014 mailed Aug. 24, 2010.
Written Opinion of the International Searching Authority mailed Aug. 24, 2010.
International Preliminary Report on Patentability for PCT/EP2010/061014 dated Feb. 16, 2012.

\* cited by examiner

*Primary Examiner* — Jack K Wang
(74) *Attorney, Agent, or Firm* — Nixon & Vanderhye PC

(57) ABSTRACT

The invention concerns a traffic detector (200) comprising:
- a hermetically closed tube (202); the said tube (202) delimiting at least one chamber (218), each chamber (218) extending from one of the ends of the said tube (202),
- for each chamber (218), a piezoelectric sensor placed at the corresponding end of the tube (202) and suitable for transforming the shock waves received into an electrical signal;
- the traffic detector (200) being characterised in that it comprises an elastic band (204) and fixing devices (208, 210) intended to keep the said elastic band (204) tensioned between the ends of the said tube (202).

10 Claims, 1 Drawing Sheet

TRAFFIC DETECTOR

This application is the U.S. national phase of International Application No. PCT/EP2010/061014 filed 29 Jul. 2010 which designated the U.S. and claims priority to FR 09/55384 filed 31 Jul. 2009, the entire contents of each of which are hereby incorporated by reference.

The invention concerns a detector for a traffic counter as well as a traffic counter comprising such a detector. It finds an application in the field of vehicle traffic counters.

A traffic counter is known that conventionally comprises a tube placed temporarily on a roadway, the traffic of which is to be counted. This tube is filled with air and has at one of the ends thereof a piezoelectric sensor.

This traffic detector is integrated in a counter that also comprises associated electronics. The piezoelectric sensor detects the variations in air pressure inside the tube under the effect of the crushing of the tube by the vehicles and transmits the electrical pulses thus generated to the associated electronics, which count the vehicles passing over the roadway.

Figure 1:
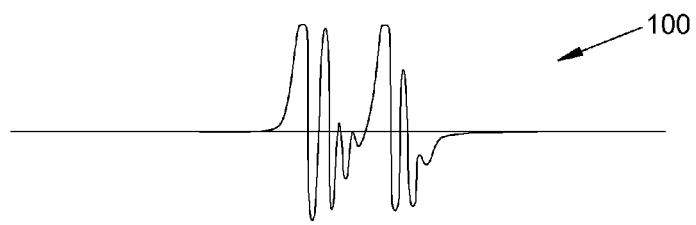

FIG. 1 shows the signal 100 generated by the piezoelectric sensor during the passage of a vehicle. Between the two main peaks, each representing the passage of one of the wheels, several residual oscillations disturb the associated electronics. If one of these residual oscillations is too great, the associated electronics may then count two vehicles whereas there is only one. In addition, the traffic detector will be incapable of distinguishing a second lighter vehicle generating lower main peaks passing in the same period of time as one of these residual oscillations.

One object of the present invention it to propose a detector for a traffic counter that does not have the drawbacks of the prior art.

To this end, a traffic detector is proposed, the traffic counter comprising:
  a hermetically closed tube; the said tube delimiting at least one chamber, each chamber extending from one of the ends of the said tube,
  for each chamber, a piezoelectric sensor placed at the corresponding end of the tube and suitable for transforming the shock waves received into an electrical signal;
  the traffic detector being characterised in that it comprises an elastic band and fixing devices intended to keep the said elastic band tensioned between the ends of the said tube.

Advantageously, the traffic detector comprises two chambers separated by an intermediate airtight plug.

Advantageously, the traffic detector comprises fibre tufts fixed to the elastic band.

Advantageously, each fibre tuft is a strand of wool.

Advantageously, each fixing device is a torsion spring.

Advantageously, the elastic band is flat.

Advantageously, the elastic band is twisted.

The invention also proposes a traffic counter for a traffic lane, characterised in that it comprises:
  a first traffic detector according to one of the above variants and comprising a single chamber placed on the said traffic lane, and
  associated electronics electrically connected to the said piezoelectric sensor and suitable for counting the number of vehicles passing over the said traffic lane from the electrical signal received.

The invention also proposes a traffic counter for two traffic lanes, characterised in that it comprises:
  a first traffic detector according to one of the preceding variants and comprises two chambers, each being placed on one of the traffic lanes, and
  associated electronics electrically connected to each of the said piezoelectric sensors and suitable for counting the number of vehicles passing over each of the said traffic lanes from each electrical signal received.

Advantageously, the traffic counter comprises a second traffic detector following the said first traffic detector, the piezoelectric sensor or sensors of which is or are electrically connected to the associated electronics, and the associated electronics are suitable for measuring the speed and/or wheelbase of each vehicle passing over the said traffic lane from each electrical signal received.

Figure 3:
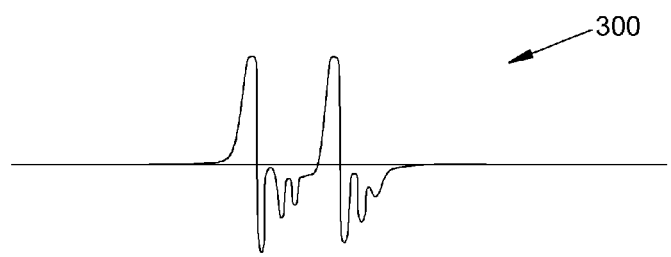
Figure 2:
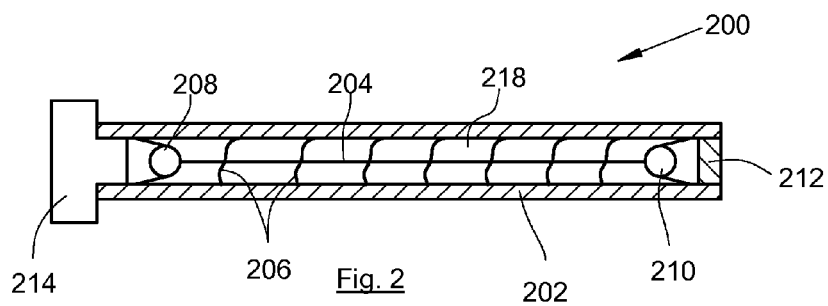
Figure 4:
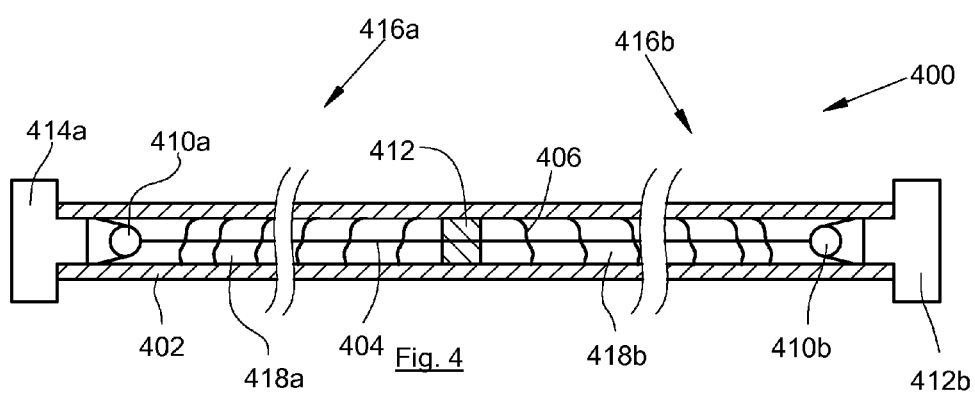

The features of the invention mentioned above, as well as others, will emerge more clearly from a reading of the following description of an example embodiment, the said description being given in relation to the accompanying drawings, among which:

FIG. 1 shows the signal delivered by a piezoelectric sensor of a traffic detector of the prior art, FIG. 2 shows a cross section of a traffic detector according to a first embodiment of the invention, FIG. 3 shows the signal delivered by the piezoelectric sensor of the traffic detector according to the invention, and FIG. 4 shows a cross section of a traffic detector according to a second embodiment of the invention.

FIG. 2 shows a traffic detector 200 that comprises a hermetically closed tube 202. The inside of the tube 202 defines a chamber 218 that extends between the two ends of the tube 202. In the embodiment presented in FIG. 2, one of the ends of the tube 202 is closed by a plug 212 and the other end is closed by a closure device 214.

Inside the closure device 214 a piezoelectric sensor is placed that transforms the shock waves received from the inside of the tube 202 into an electrical signal that is transmitted to associated electronics.

According to a particular embodiment of the invention, the closure device also comprises a balancing device that affords slow balancing between the internal pressure of the tube 202 and the external pressure in the event of overpressure or negative pressure inside the tube 202 compared with the external pressure, which is atmospheric pressure.

The tube 210 is preferably produced from rubber and is filled with a compressible element such as air.

The passage of a vehicle over the tube 210 generates, in the air, a shock wave that is transmitted as far as the piezoelectric sensor and then, in the form of electrical pulses, as far as the associated electronics, which thus count the passage of the vehicle wheels.

Inside the tube 202 an elastic band 204 and two fixing devices 208 and 210 are arranged. The elastic band 204 constitutes a mechanical damping device that damps any residual oscillations.

To improve the result further and to practically cancel out any residual oscillations, tufts of fibres 206 permeable to air such as for example strands of wool or cotton are fixed to the elastic band 204.

The elastic band 204 is, according to a particular embodiment of the invention, a flat elastic band and each of the ends is fixed to one of the fixing devices 208, 210 so as to keep the elastic 204 tensioned inside the tube 202 between the two ends of the latter.

According to a particular embodiment, the elastic is twisted inside the tube 202.

Each fixing device 208, 210 can take the form of a torsion spring, the separation of the arms of which ensures the placing and fixing in the tube 202. In this embodiment, each end of the elastic 204 is fixed by a knot to the turns of the spring 208, 210.

The wool strands 206 are fixed to the elastic band 204 at substantially regular intervals from one another, for example approximately 50 cm.

In a particular embodiment, the tube 202 has a length of 6 m, an inside diameter of 5 mm and an outside diameter of 15 mm, each wool strand has a length of 4 cm, the elastic band 204 has an idle length of 5 m and a length in position in the tube 202 of 6 m, equal to the length of the tube 202.

FIG. 3 shows an electrical signal 300 generated by the piezoelectric sensor when a bicycle passes over the tube 202 of the traffic detector 200. Between the two main peaks, each representing the passage of a wheel, the residual oscillations that remain present have amplitudes that are much reduced compared with the amplitudes of the residual oscillations of the signal of the prior art. Thus the associated electronics can easily differentiate the peak representing the passage of a wheel and the residual oscillations and thus they can effect a precise counting of the number of wheels passing over the tube 202, including in the case of mixed traffic (for example bicycles/cars) or if vehicles are travelling practically abreast.

The traffic detector 200 of FIG. 2 is more particularly suited to the case of a single traffic lane.

FIG. 4 shows a traffic detector 400 that is more particularly suited to the case of two traffic lanes in the same direction or in opposite directions.

The traffic detector 400 comprises:
a hermetically closed tube 402; the tube 402 here delimits two chambers 418a and 418b, each chamber 418a, 418b extending from one of the ends of the tube 402, and
for each chamber 418a, 418b, a piezoelectric sensor placed at the corresponding end of the tube 402 and suitable for transforming the shock waves received into an electrical signal.

The traffic detector 400 comprises an elastic band 404 and fixing devices 410a and 410b intended to keep the elastic band 404 tensioned between the ends of the tube 402. The elastic band 402 thus passes through each chamber 418a, 418b.

The two chambers 418a and 418b are coaxial and extend parallel to the axis of the tube 402.

Each piezoelectric sensor is placed inside a closure device 414a, 414b, which can also be provided with a pressure balancing device.

The two chambers 418a and 418b are separated from each other by an intermediate airtight plug 412 cast inside the tube 402 in order to close it off The intermediate plug 412 is here placed substantially half way along the tube 402. The intermediate plug 412 has the elastic band 404 passing through it and holds it. The intermediate plug 412 may for example be produced by injecting silicone through the wall of the tube 402 by means of a syringe.

The intermediate plug 412 thus divides the traffic detector 400 into two subassemblies 416a and 416b.

The traffic detector 400 thus consists of two isolated traffic sub-detectors 416a and 416b, each being intended to be positioned on one of the traffic lanes. Each piezoelectric sensor then delivers information relating to the corresponding traffic lane.

As with the first embodiment of the invention, each traffic sub-detector 416a, 416b comprises tufts of fibres 406, preferably wool strands, fixed to the elastic band 404.

As with the first embodiment of the invention, the elastic band 404 is preferably flat and twisted.

A traffic counter according to the invention is used for counting the number of vehicles passing over a traffic lane. For this purpose, the traffic counter comprises a first traffic detector 200 according to the first embodiment of the invention and comprising a single chamber 218 placed on the traffic lane and the associated electronics electrically connected to the piezoelectric sensor and suitable for counting the number of vehicles passing over the traffic lane from each electrical signal received.

In another embodiment, a traffic counter can be used for counting the number of vehicles passing over two traffic lanes.

The traffic counter then comprises a first traffic detector 400 according to the second embodiment of the invention and comprising two chambers 418a and 418b, each being placed on one of the traffic lanes, and the associated electronics electrically connected to each of the piezoelectric sensors and able to count the number of vehicles passing over each of the traffic lanes from each electrical signal received.

In particular, the detection of each main peak makes it possible to count the number of wheels passing over the tube 202 and therefore to deduce therefrom the number of vehicles.

The traffic counter can also make it possible to measure the speed and/or wheelbase of each vehicle passing over the traffic lane. For this purpose, the traffic counter comprises a second traffic detector 200, 400 placed on the same traffic lane and following the first traffic detector 200, 400. The piezoelectric sensor or sensors of the second traffic detector 200, 400 is or are electrically connected to the associated electronics, which are able to measure the speed and/or wheelbase of each vehicle passing over the traffic lane from each electrical signal received.

In order to limit the possibilities of interference between several vehicles travelling on the same traffic lane, the two traffic detectors 200, 400 are relatively close to each other; for example they are at a distance D of around 30 cm.

An example of calculation of the speed and wheelbase of the vehicle is given below for a traffic detector 200 according to the first embodiment of the invention.

The electrical signal delivered by the first traffic detector 200 makes it possible to measure the time between the passage of the front wheel and the passage of the rear wheel over the said first traffic detector 200 by measuring the time elapsed between the two main peaks.

Knowledge of the time elapsed between the appearance of the first main peak representing the passage of the front wheel over the first traffic detector 200 and the appearance of the first main peak representing the passage of the front wheel over the second traffic detector 200, as well as knowledge of the distance between the first traffic detector 200 and the second traffic detector 200, makes it possible to calculate the speed of the vehicle.

The wheelbase of the vehicle is then equal to the product of its speed and the time between the passage of the front wheel and the passage of the rear wheel over the first traffic detector 200.

Naturally the present invention is not limited to the examples and embodiments described and depicted but is capable of numerous variants accessible to persons skilled in the art.

The invention claimed is:

1. Traffic detector (200, 400) comprising:
 a hermetically closed tube (202, 402); the said tube (202, 402) delimiting at least one chamber (218, 418a, 418b), each chamber (218, 418a, 418b) extending from one of the ends of the said tube (202, 402),
 for each chamber (218, 418a, 418b), a piezoelectric sensor placed at the corresponding end of the tube (202, 402) and suitable for transforming the shock waves received into an electrical signal;

the traffic detector (200, 400) being characterised in that it comprises an elastic band (204, 404) and fixing devices (208, 210, 410a, 410b) intended to keep the said elastic band (204, 404) tensioned between the ends' of the said tube (202, 402).

2. Traffic detector (400) according to claim 1, characterised in that it comprises two chambers (418a, 418b) separated by an airtight intermediate plug (412).

3. Traffic detector (200, 400) according to claim 1, characterised in that it comprises tufts of fibres (206, 406) fixed to the elastic band (204, 404).

4. Traffic detector (200, 400) according to claim 3, characterised in that each tuft of fibres (206, 406) is a wool strand.

5. Traffic detector (200, 400) according to claim 1, characterised in that each fixing device (208, 210, 410a, 410b) is a torsion spring.

6. Traffic detector (200, 400) according to claim 1, characterised in that the elastic band (204, 404) is flat.

7. Traffic detector (200, 400) according to claim 1, characterised in that the elastic band (204, 404) is twisted.

8. Traffic counter for a traffic lane, characterised in that it comprises:
   a first traffic detector (200) according to claim 1 and comprising a single chamber (218) placed on the said traffic lane, and
   associated electronics electrically connected to the said piezoelectric sensor and able to count the number of vehicles passing over the said traffic lane from the electrical signal received.

9. Traffic counter for two traffic lanes, characterised in that it comprises:
   a first traffic detector (200) according to claim 1 and comprising two chambers (418a, 418b), each being placed on one of the traffic lanes, and
   associated electronics electrically connected to each of the said piezoelectric sensors and able to count the number of vehicles passing over each of the said traffic lanes from each electrical signal received.

10. Traffic counter according to claim 8, characterised in that it comprises a second traffic detector (200, 400) following the said first traffic detector (200, 400) and the piezoelectric sensor or sensors of which is or are electrically connected to the associated electronics, and in that the associated electronics are able to measure the speed and/or wheelbase of each vehicle passing over the said traffic lane from each electrical signal received.

* * * * *